(12) United States Patent
Chen

(10) Patent No.: US 9,048,381 B1
(45) Date of Patent: Jun. 2, 2015

(54) METHOD FOR FABRICATING LIGHT-EMITTING DIODE DEVICE

(71) Applicant: LEXTAR ELECTRONICS CORPORATION, Hsinchu (TW)

(72) Inventor: Jun-Rong Chen, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/281,750

(22) Filed: May 19, 2014

(30) Foreign Application Priority Data

Dec. 6, 2013 (TW) .............................. 102144771 A

(51) Int. Cl.
*H01L 21/00* (2006.01)
*H01L 33/22* (2010.01)
*H01L 33/00* (2010.01)

(52) U.S. Cl.
CPC .............. *H01L 33/22* (2013.01); *H01L 33/005* (2013.01); *H01L 2933/0058* (2013.01)

(58) Field of Classification Search
USPC .......................................... 438/29, 28, 69, 74
See application file for complete search history.

(56) References Cited

U.S. PATENT DOCUMENTS 7,655,959 B2   2/2010   Lee et al.
7,977,695 B2   7/2011   Shim et al.

FOREIGN PATENT DOCUMENTS

TW            201216503        4/2012

*Primary Examiner* — Timor Karimy

(57) ABSTRACT

The invention provides a method for fabricating a light-emitting diode device. The method includes providing a carrier having a first surface and a second surface. The first surface has insulating micro patterns. A buffer layer, a first-type semiconductor layer, a light-emitting layer and a second-type semiconductor layer are grown on the first surface to form a light-emitting lamination layer. A substrate is provided for the second-type semiconductor layer to bond on. The carrier is lifted off from the light-emitting lamination layer by a laser lift-off process, and surfaces of the insulating micro patterns and a surface of the buffer layer between the insulating micro patterns are exposed. The insulating micro patterns and the buffer layer are removed. Recess structures are formed on the first-type semiconductor layer. A surface-roughing process is then performed on the recess structures.

10 Claims, 11 Drawing Sheets

METHOD FOR FABRICATING LIGHT-EMITTING DIODE DEVICE

CROSS REFERENCE TO RELATED APPLICATIONS

This Application claims priority of Taiwan Patent Application No. 102144771, filed on Dec. 6, 2013, the entirety of which is incorporated by reference herein.

BACKGROUND OF THE INVENTION

1. Field of the Invention

The present invention relates to a method for fabricating a light-emitting diode (LED) device, and in particular it relates to a surface-roughing process in fabricating an LED device.

2. Description of the Related Art

Light-emitting diodes (LEDs) have two configurations. The LED that has electrodes arranged on the same side of an LED chip is called a horizontal LED. The LED that has electrodes arranged on the opposite sides of an LED chip is called a vertical LED. A current path flowing in and out of a semiconductor light-emitting layer of the horizontal LED needs to be turned in a direction horizontal to the LED chip. A current path can flow in and out of a semiconductor light-emitting layer of the vertical LED without turning in different directions.

The LED chip of the LED device usually grows on a substrate wafer by an epitaxial growth method. In fabrication processes of the LED device, however, the substrate wafer need to be cut to fabricate the individual LED chips for epitaxial layers to grow on the LED chips. The loss due to the substrate wafer sawing process is high when the LED chips have a small area. Therefore, the total light-emitting area of the substrate wafer is reduced. Further, a sapphire carrier removal process is required to be adopted in the conventional fabrication processes of the LED device. The sapphire carrier removal process is too complex to control the fabrication cost and yield.

Thus, a novel LED device and a method for fabricating the same are desired.

BRIEF SUMMARY OF THE INVENTION

A method for fabricating a light-emitting diode device is provided. An exemplary embodiment of the method includes providing a carrier having a first surface and a second surface on opposite sides of the carrier. The first surface has a plurality of insulating micro patterns. The carrier and the plurality of insulating micro patterns are formed by different materials. A buffer layer, a first-type semiconductor layer, a light-emitting layer and a second-type semiconductor layer are grown on the first surface of the carrier in sequence to form a light-emitting lamination layer. A substrate is provided for the second-type semiconductor layer of the light-emitting lamination layer to bond on. The carrier is lifted off from the light-emitting lamination layer by a laser lift-off process, and surfaces of the plurality of insulating micro patterns and a surface of the buffer layer between the plurality of insulating micro patterns are exposed. The plurality of insulating micro patterns and the buffer layer are removed. A plurality of recess structures is formed on the first-type semiconductor layer. A surface-roughing process is then performed on the plurality of recess structures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
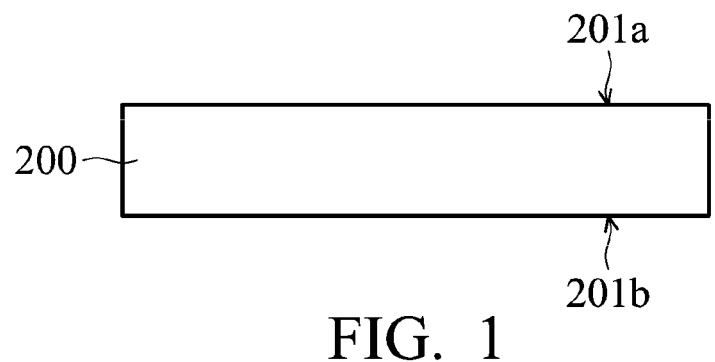
FIGS. 1-8 are schematic cross-sectional views of one embodiment of a method for fabricating a light-emitting diode device of the invention.

The following description is of the contemplated mode of carrying out the invention. This description is made for the purpose of illustrating the general principles of the invention and should not be taken in a limiting sense. The scope of the invention is best determined by reference to the appended claims.

The present invention will be described with respect to embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Embodiments provide a method for fabricating a light-emitting diode (LED) device. In some embodiments, the LED device includes a horizontal LED device or a vertical LED device. The method for fabricating an LED device uses a sapphire carrier having a plurality of silicon oxide micro patterns for a light-emitting lamination layer to be formed thereon. Compared with the conventional method for fabricating an LED device, one embodiment of a lift-off process which is used to lift off the sapphire carrier for fabricating the LED device only focuses a laser beam on an interface between the sapphire carrier and the silicon oxide micro patterns with a planar profile. The planar interface can reduce depth of focus (DOF) of the laser beam, so that the maximum energy density of the laser beam is reduced. Also, a wet etching method can be performed to remove the μm-scaled silicon oxide micro patterns after performing the lift-off process for the sapphire carrier, so that an n-type semiconductor layer of the light-emitting lamination layer is formed as a plurality of μm-scaled recess structures. Additionally, a surface-roughing process is performed by a wet or dry etching method to further roughen surfaces of the μm-scaled recess structures of the n-type semiconductor layer, so that the surfaces of the μm-scaled recess structures are roughened as surfaces with an nm-scaled roughness. The surface-roughing process can destroy the smooth surfaces of the recess structures to increase the light-emitting efficiency of the LED device.

FIGS. 1-8 are schematic cross-sectional views of one embodiment of a method for fabricating a light-emitting diode (LED) device 500a of the invention. In this embodiment, the LED device 500a serves as a horizontal LED device 500a. Please refer to FIG. 1. Firstly, a carrier 200 is provided. The carrier 200 has a first surface 201a and a second surface 201b on opposite sides of the carrier 200. In one embodiment, the carrier 200 is formed of sapphire.

Figure 2:
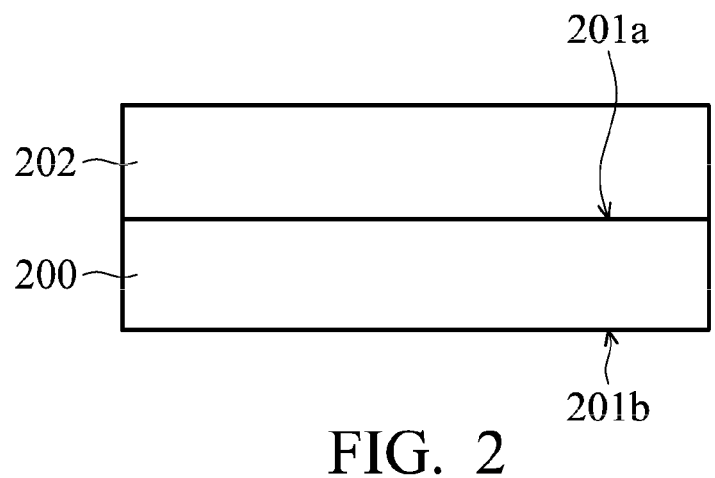

Next, please refer to FIG. 2. An insulating layer 202 is formed on the first surface 201a of the carrier 200. The insulating layer 202 may be formed using thin-film deposition methods including an e-gun method, a chemical vapor deposition (CVD) method or a physical vapor deposition (PVD) method. In one embodiment, the insulating layer 202 may be formed of insulating materials including silicon oxide. In one embodiment, the carrier 200 and the insulating layer 202 are formed of different materials.

Figure 3:
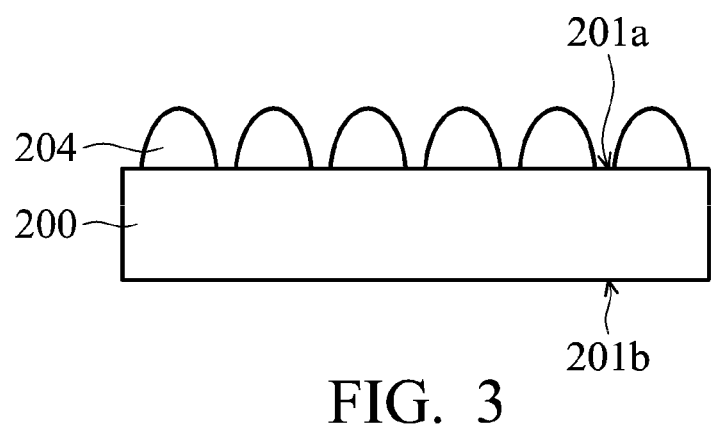

Next, please refer to FIG. 3. A photolithography process is performed to form a mask pattern (not shown) on the insulating layer 202. In one embodiment, the size of the mask pattern is in the μm scale. The size of the mask pattern is in a range between about 1 μm and 5 μm. Next, an anisotropic etching process, for example, an inductively coupled plasma reactive ion etching (ICP-RIE) process, is performed to remove the insulating layer 202 without being covered by the mask pattern. Also, the mask pattern is over-etched during the anisotropic etching process. Next, the remaining mask pattern is removed to form a plurality of insulating micro patterns 204. In one embodiment, the insulating micro patterns 204 may be silicon oxide micro patterns. In one embodiment, the size of the insulating micro patterns 204, which is in the μm scale, is substantially the same as that of the mask pattern. The size of the insulating micro patterns 204 is in a range between about 1 μm and 5 μm. In one embodiment, the carrier 200 and the insulating micro patterns 204 are formed of different materials.

Figure 4:
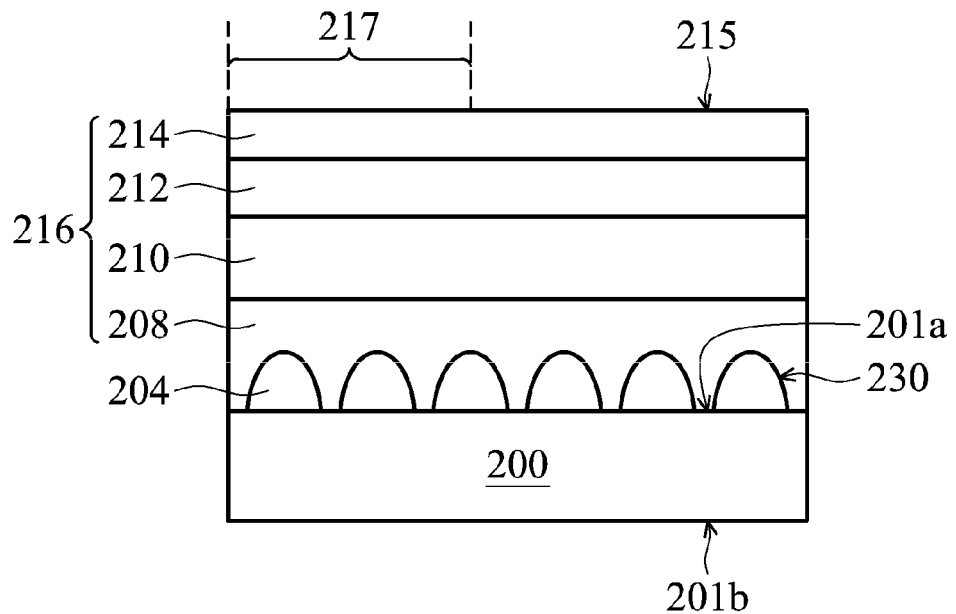

Next, please refer to FIG. 4, a buffer layer 208, a first-type semiconductor layer 210, a light-emitting layer 212 and a second-type semiconductor layer 214 are grown on the first surface 201 of the carrier 200 in sequence to form a light-emitting lamination layer 216. In one embodiment, the first-type semiconductor layer 210, the light-emitting layer 212 and the second-type semiconductor layer 214 are grown by thin-film deposition methods including a metal-organic chemical vapor deposition (MOCVD) or molecular beam epitaxy (MBE) process. In one embodiment, a surface 230 of the buffer layer 208 is in contact with the insulating micro patterns 204 as shown in FIG. 4.

It should be noted that the terms "first-type" and "second-type" in the description hereinafter are used to describe a conduction type of a semiconductor layer. The first-type is a conduction type opposite to the second-type. For example, if the first-type is n-type, the second-type is p-type. Alternatively, if the first-type is p-type, the second-type is n-type. In this embodiment, the first-type semiconductor layer 210 is an n-type semiconductor layer, and the second-type semiconductor layer 214 is a p-type semiconductor layer. Also, in one embodiment, the first-type semiconductor layer 210 and the second-type semiconductor layer 214 may be formed of semiconductor materials including GaN, GaP, GaAsP, AlGaAs, InGaAlP or InGaN. In this embodiment, the first-type semiconductor layer 210 is an n-type GaN layer, and the second-type semiconductor layer 214 is a p-type GaN layer. Additionally, in one embodiment, the buffer layer 208 is an un-doped semiconductor layer. The buffer layer 208 is used to reduce stresses and defects occurring because of the lattice mismatch during the growth of the light-emitting lamination layer 216. In one embodiment, the light-emitting layer 212 may be a semiconductor layer having multiple quantum wells (MQWs). For example, the light-emitting layer 212 may be formed of semiconductor materials including GaN or InGaN.

Next, an etching process is performed on an area 217 of the light-emitting lamination layer 216 as shown in FIG. 4. The etching process is performed from a surface 215 away from the light-emitting layer 212 to partially remove the second-type semiconductor layer 214, the light-emitting layer 212 and first-type semiconductor layer 210 to expose a portion of the first-type semiconductor layer 210a. After performing the aforementioned processes, a light-emitting mesa structure 211, which includes the first-type semiconductor layer 210a, a light-emitting layer 212a and a second-type semiconductor layer 214a, is formed as shown in FIG. 5.

Figure 5:
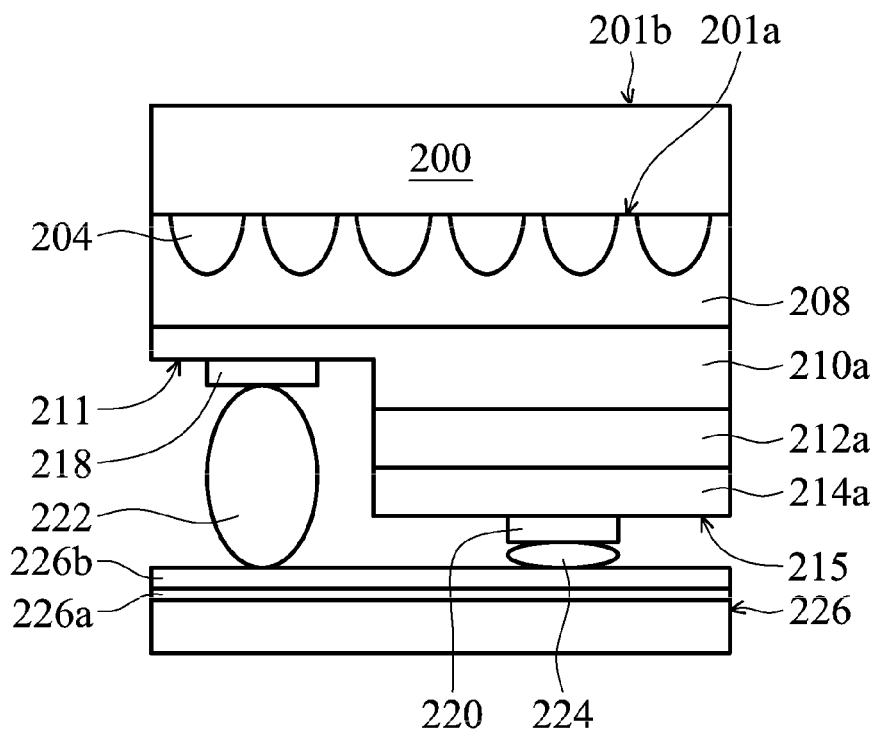

Next, a photolithography process is performed to form a photoresist layer (not shown) covering an exposed surface of the first-type semiconductor layer 210a and an exposed surface (i.e. the surface 215) of the second-type semiconductor layer 214a of the light-emitting mesa structure 211 as shown in FIG. 5. The photoresist layer has at least two openings (not shown), and a portion of the first-type semiconductor layer 210a and a portion of the second-type semiconductor layer 214a are exposed to the at least two openings. In one embodiment, formation positions of the at least two openings correspond to contact positions defined on the first-type semiconductor layer 210a and the second-type semiconductor layer 214a of the light-emitting mesa structure 211. Next, a deposition process such as an electroplating method is performed to fill a conductive material (not shown) into the at least two openings of the photoresist layer. The conductive material is fully filled the at least two openings. In one embodiment, the conductive material may be formed of copper (Cu), gold (Au), silver (Ag) or combinations thereof. Next, a planarization process, such as an etching back process, is performed to remove a portion of the conductive material over the photoresist layer, so that a top surface of the conductive material is substantially aligned to that of the photoresist layer. After performing the planarization process, a first electrode 218 and a second electrode 220 are respectively formed on the first-type semiconductor layer 210a and the second-type semiconductor layer 214a of the light-emitting mesa structure 211 as shown in FIG. 5.

Next, a substrate 226 is provided as shown in FIG. 5. Next, the light-emitting mesa structure 211 is flipped up-side down, so that the surface 215 of the second-type semiconductor layer 214a faces down. Next, a flip-chip bonding process is performed so that the first-type semiconductor layer 210a and the second-type semiconductor layer 214a of the light-emitting mesa structure 211 are bonded to a surface of the substrate 226 respectively through the first electrode 218 and the second electrode 220. In one embodiment, the substrate 226 may be a semiconductor substrate including a pad layer 226a and an ohmic contact layer 226b. The substrate 226 bonds to the first electrode 218 and the second electrode 220 of the light-emitting lamination layer 211 through the ohmic contact layer 226b. In other embodiments, the substrate 226 may serve as a metal substrate, such as a copper substrate. In one embodiment, the first electrode 218 and the second electrode 220 of the light-emitting lamination layer 211 bond to a surface 217 of the substrate 226 through the solder bumps 222 and 224, respectively. In one embodiment, the solder bumps 222 and 224 may be formed of Sn—Ag alloys, Sn—Cu alloys, Ni—Ag alloys or combinations thereof.

Figure 6:
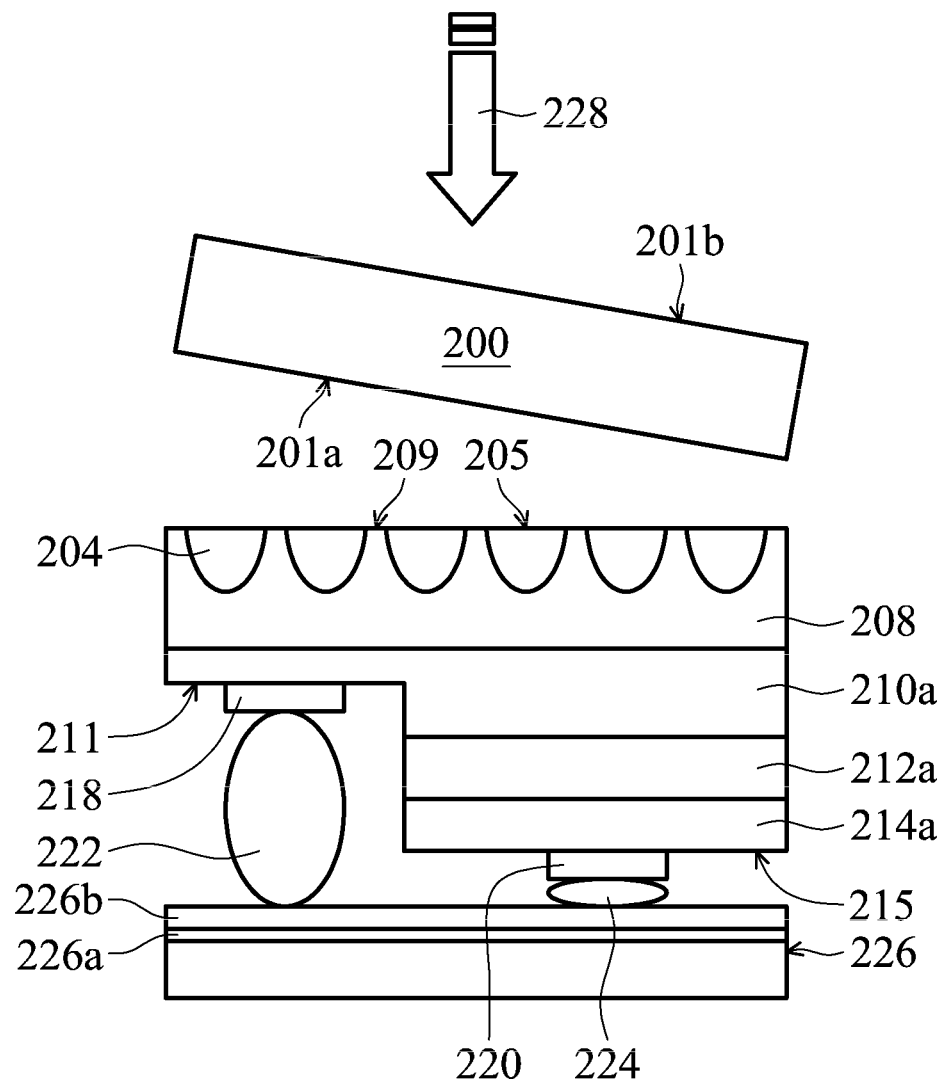
Figure 16:
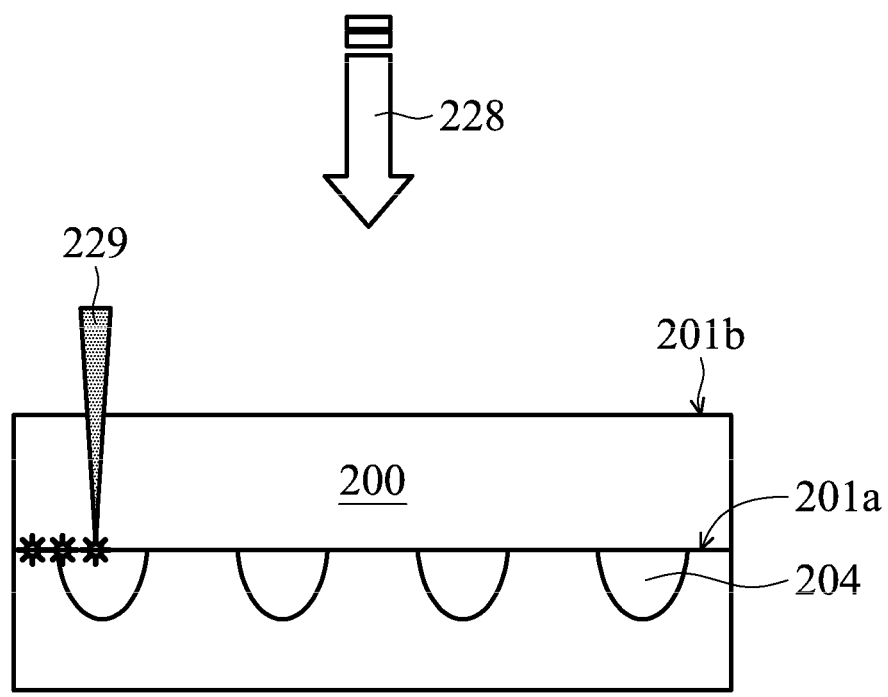
FIG. 16 is a schematic diagram of one embodiment of a laser lifting process, showing a focus position of one embodiment of a laser beam of the invention.

Next, a laser lift-off process 228 is performed to lift the carrier 200 off the light-emitting lamination layer 211, and surfaces 205 of the plurality of insulating micro patterns 204 and a surface 209 of the buffer layer 208 between the plurality of insulating micro patterns 204 are exposed as shown in FIG. 6. Please refer to FIGS. 6 and 16. FIG. 16 is a schematic diagram of one embodiment of a laser lifting process, showing a focus position of a laser beam 229. While performing the laser lifting process 228, the laser beam 229 of the laser lifting process 228 is focused on an interface (also positioned at the first surface 201a of the carrier 200) between the carrier 200 and the plurality of insulating micro patterns 204 and scans along the interface. Therefore, the carrier 200 is lifted off from the surfaces 205 of the plurality of insulating micro patterns 204 and the surface 209 of the buffer layer 208 between the plurality of insulating micro patterns 204. In one embodiment, the interface is substantially a planar surface. Compared with the conventional laser lift-off process, which is required to be focused on a roughened surface of a patterned sapphire substrate (PSS), one embodiment of the laser lift-off process 228 has a larger process window than the conventional laser lift-off process.

Figure 7:
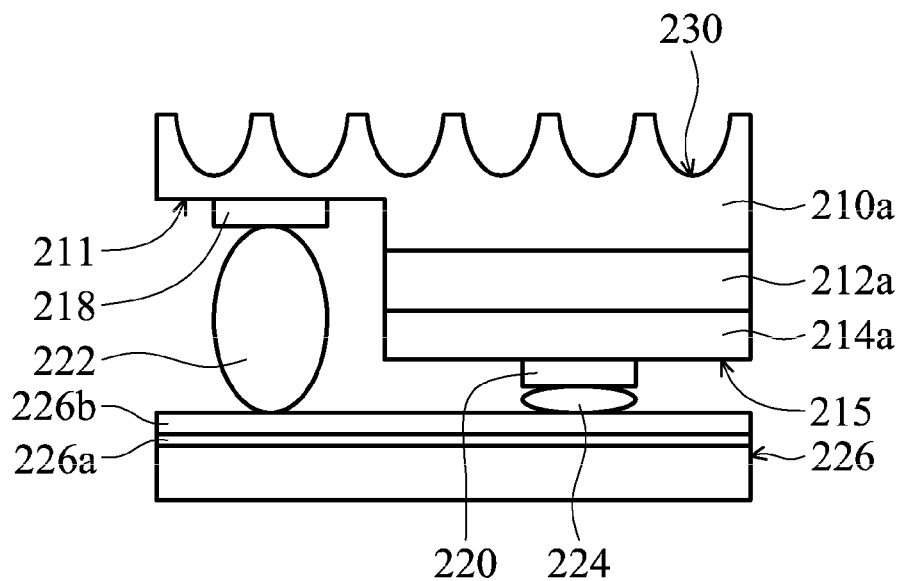

Next, the plurality of insulating micro patterns 204 and the buffer layer 208 as shown in FIG. 6 are removed until the first-type semiconductor layer 210a is exposed. Therefore, a plurality of recess structures 230 is formed on the first-type semiconductor layer 210a as shown in FIG. 7. In one embodiment, the plurality of insulating micro patterns 204 is removed by a wet etching process 246. In this embodiment, because the plurality of insulating micro patterns 204 is formed of silicon oxide materials, the plurality of insulating micro patterns 204 is removed by a buffer oxide etching (BOE) process. The plurality of insulating micro patterns 204 can be totally removed by the BOE process. Additionally, in one embodiment, the size of the plurality of recess structures 230 is in μm scale, and the size is in a range between about 1 μm and 5 μm.

Figure 8:
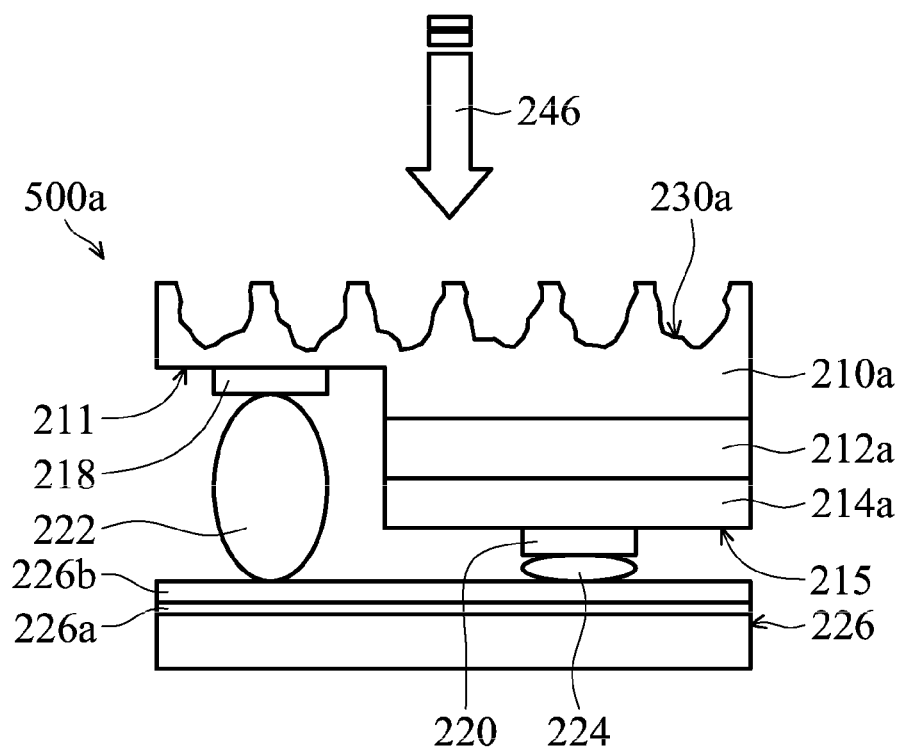

Next, a surface-roughing process 246 is performed to roughen a plurality of surfaces of the plurality of recess structures 230, so that a plurality of roughened recess structures 230a is formed as shown in FIG. 8. In one embodiment, the surface-roughing process is performed by a dry etching or a wet etching process. In this embodiment, the surface-roughing process is performed using KOH as an etchant. In one embodiment, the size of surfaces of the plurality of roughened recess structures 230a is nm scale, and the size is in a range between about 10 nm and 1000 nm. After performing the aforementioned processes, one embodiment of the LED device 500a is completely formed.

FIGS. 9-15 are schematic cross-sectional views of another embodiment of a method for fabricating an LED device 500b of the invention. Elements of the embodiments that are the same or similar as those previously described with reference to FIGS. 1-8 are hereinafter not repeated for brevity.

Firstly, a carrier 200 as shown in FIGS. 1-4 is provided. The carrier 200 has a first surface 201a and a second surface 201b on opposite sides of the carrier 200. In one embodiment, the carrier 200 and the insulating micro patterns 204 are formed of different materials. Next, a buffer layer 208, a first-type semiconductor layer 210, a light-emitting layer 212 and a second-type semiconductor layer 214 are grown on the first surface 201a of the carrier 200 in sequence to form a light-emitting lamination layer 216 as shown in FIG. 4.

Figure 9:
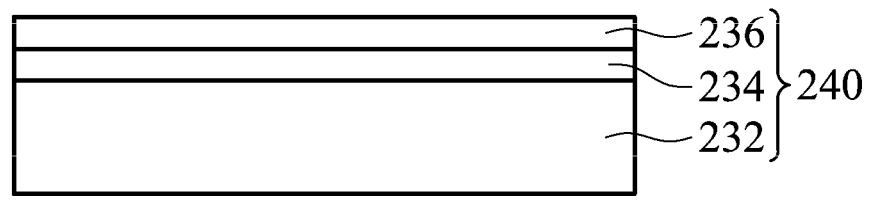
FIGS. 9-15 are schematic cross-sectional views of another embodiment of a method for fabricating a light-emitting diode device of the invention.

Next, please refer to FIG. 9. A substrate 240 is provided. In one embodiment, the substrate 240 may be a semiconductor substrate 232 including a pad layer 234 and an ohmic contact layer 236.

Figure 10:
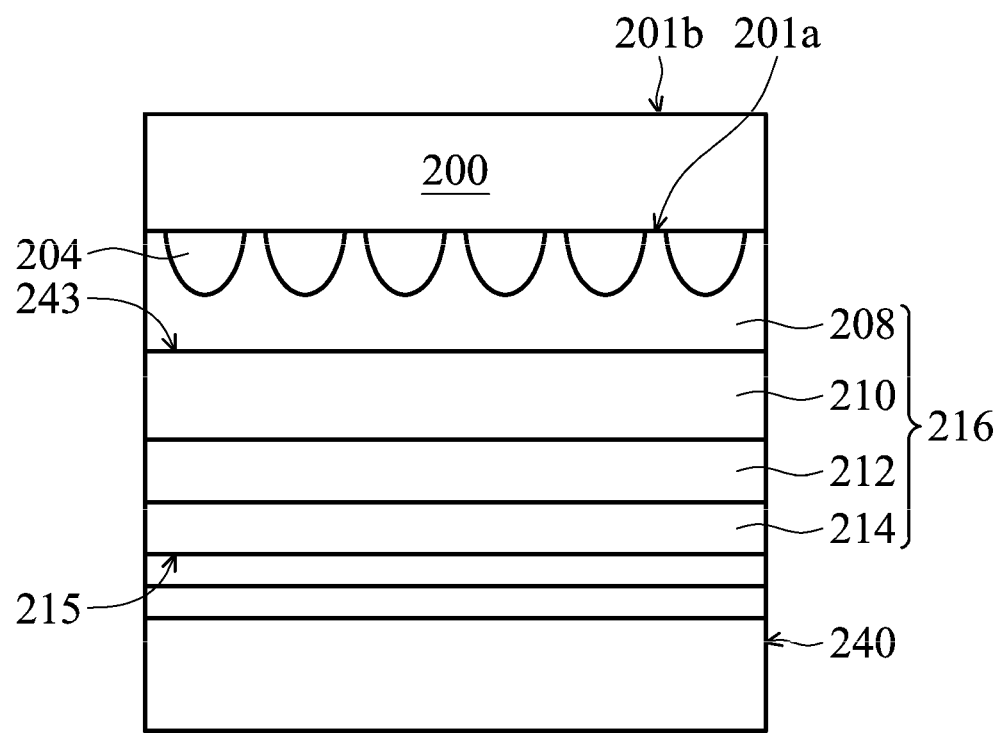

Next, please refer to FIG. 10. The light-emitting lamination layer 216 is then flipped up-side down, so that the surface 215 of the second-type semiconductor layer 214a faces down. Next, a flip-chip bonding process is performed so that the substrate 240 is bonded to the second-type semiconductor layer 214 of the light-emitting lamination layer 216. After performing the flip-chip bonding process, the surface 215 of the second-type semiconductor layer 214, which is away from the light-emitting layer 212, is in contact with the ohmic contact layer 236 of the substrate 240.

Figure 11:
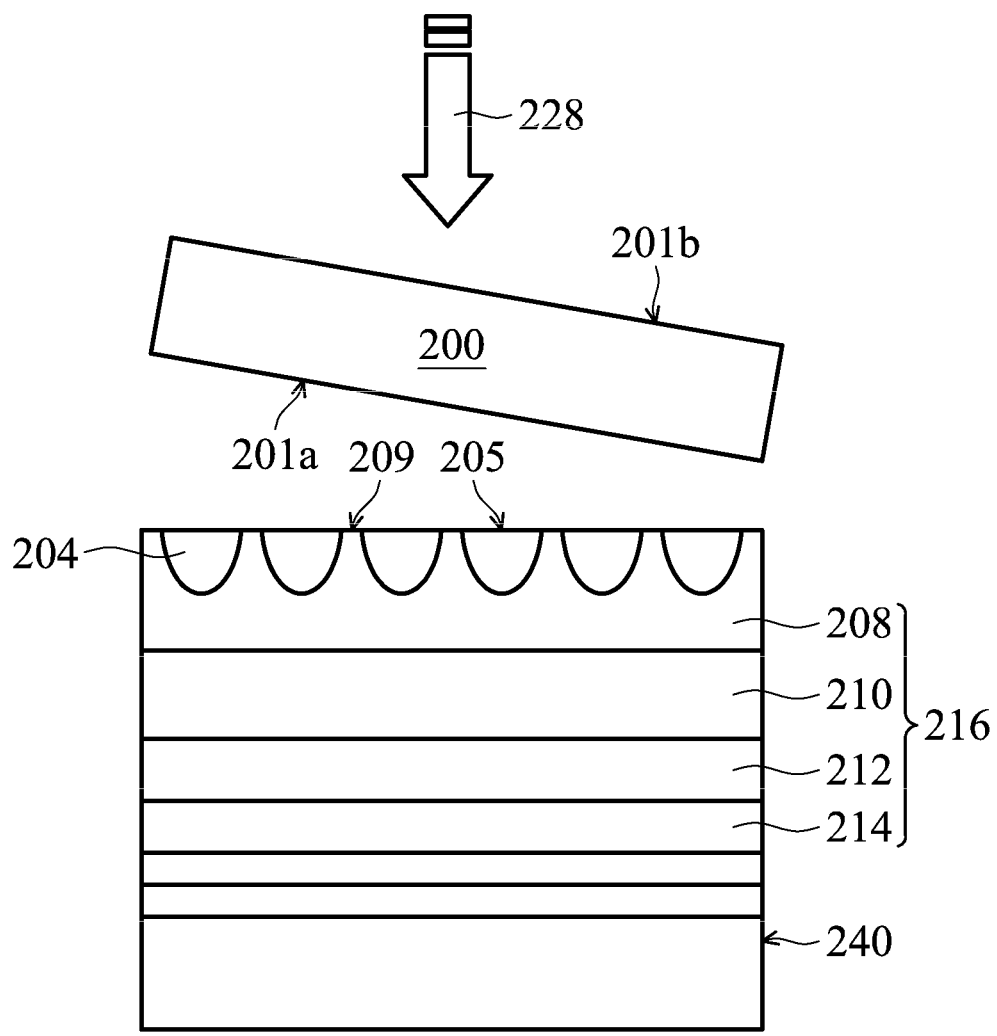

Next, a laser lift-off process 228 is performed to lift off the carrier 200 from the light-emitting lamination layer 211, and surfaces 205 of the plurality of insulating micro patterns 204 and a surface 209 of the buffer layer 208 between the plurality of insulating micro patterns 204 are exposed as shown in FIG. 11. Please refer to FIGS. 11 and 16. FIG. 16 is a schematic diagram of one embodiment of a laser lifting process, showing a focus position of a laser beam 229. While performing the laser lifting process 228, the laser beam 229 of the laser lifting process 228 is focused on an interface (also positioned at the first surface 201a of the carrier 200) between the carrier 200 and the plurality of insulating micro patterns 204 and scans along the interface. In one embodiment, the interface is substantially a planar surface. Compared with the conventional laser lift-off process, which is required focused on a rough surface of a patterned sapphire substrate (PSS), one embodiment of the laser lift-off process 228 has a larger process window than the conventional laser lift-off process.

Figure 12:
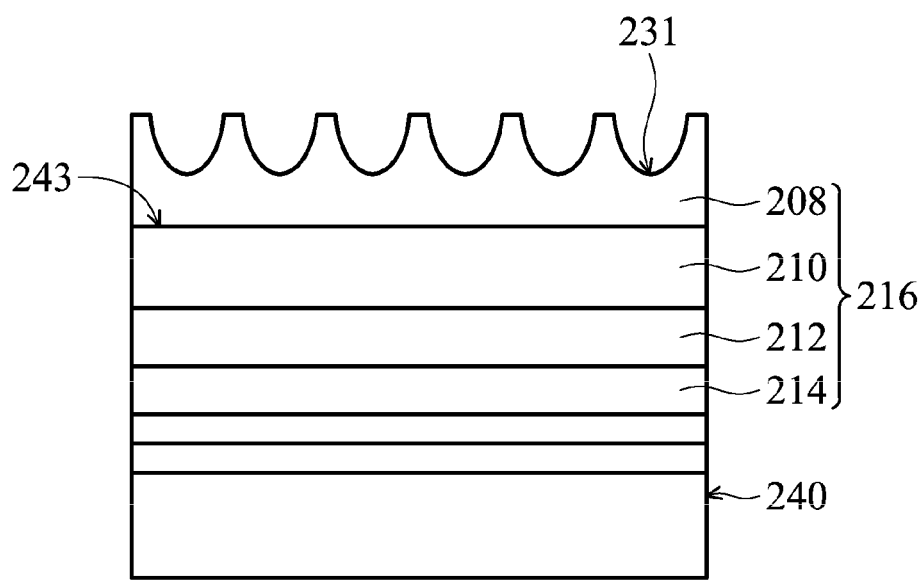
Figure 13:
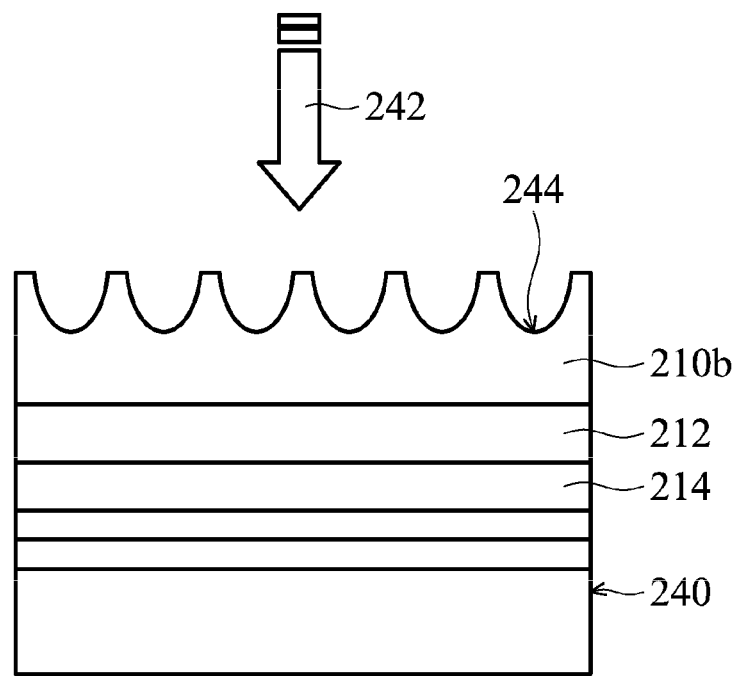

Next, the plurality of insulating micro patterns 204 as shown in FIG. 11 is removed until the buffer layer 208 is exposed. Therefore, a plurality of recess structures 231 is formed on the first-type semiconductor layer 210 as shown in FIG. 12. In one embodiment, the plurality of insulating micro patterns 204 is removed by a wet etching process 246. In this embodiment, because the plurality of insulating micro patterns 204 is formed of silicon oxide materials, the plurality of insulating micro patterns 204 is removed by a buffer oxide etching (BOE) process. The plurality of insulating micro patterns 204 can be totally removed by the BOE process. Additionally, in one embodiment, the size of the plurality of recess structures 231 is substantially the same as that of the plurality of insulating micro patterns 204. The size of the plurality of recess structures 231 is in μm scale, and the size is in a range between about 1 μm and 5 μm.

Next, a dry etching process 242, such as inductively coupled plasma reactive ion etching (ICP-RIE), is performed by using the buffer layer 208 as shown in FIG. 12 as an etching mask until the buffer layer 208 is entirely removed. Also, a portion of the first-type semiconductor layer 210 as shown in FIG. 12 is removed. After performing the dry etching process 242, a shape of the plurality of recess structures 231 is transferred to the first-type semiconductor layer 210 as shown in FIG. 12, so that a first-type semiconductor layer 210b having a plurality of recess structures 244 is formed. Similarly, the size of the plurality of recess structures 244 of the first-type semiconductor layer 210b is substantially the same as that of the plurality of insulating micro patterns 204. The size of the plurality of recess structures 244 is in μm scale, and the size is in a range between about 1 μm and 5 μm.

Figure 14:
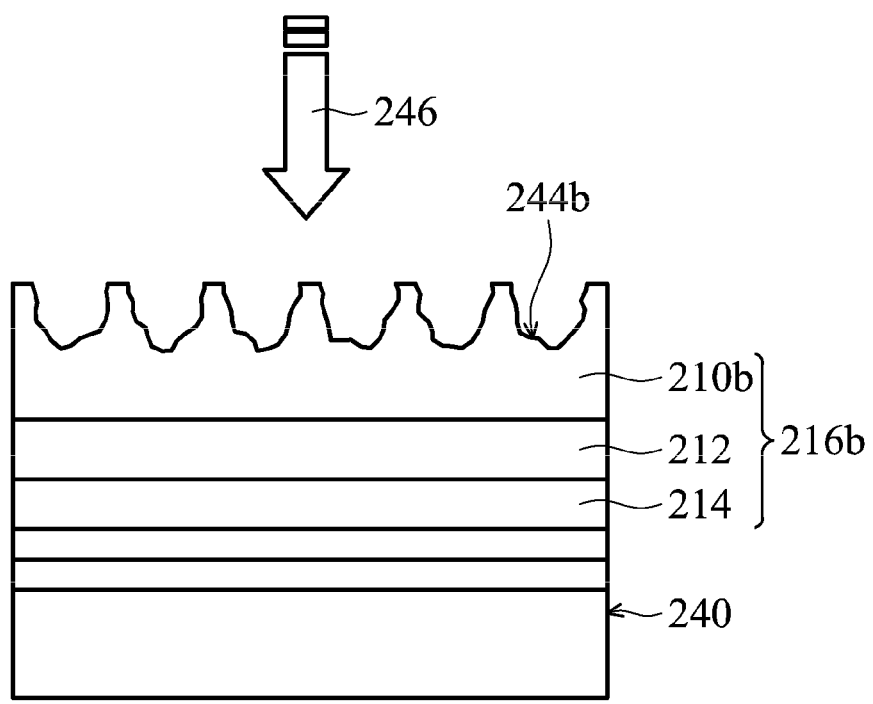

Next, a surface-roughing process 246 is performed to roughen a plurality of surfaces of the plurality of recess structures 244 of the first-type semiconductor layer 210b, so that a plurality of roughened recess structures 244b is formed as shown in FIG. 14. Also, the light-emitting layer 212 and the second-type semiconductor layer 214 and the first-type semiconductor layer 210b are collectively composed of a light-emitting lamination layer 216b having the plurality of roughened recess structures 244b. In one embodiment, the surface-roughing process is performed by a dry etching or a wet etching process. In this embodiment, the surface-roughing process is performed using KOH as an etchant. In one embodiment, the size of surfaces of the plurality of roughened recess structures 230a is nm scale, and the size is in a range between about 10 nm and 1000 nm.

Figure 15:
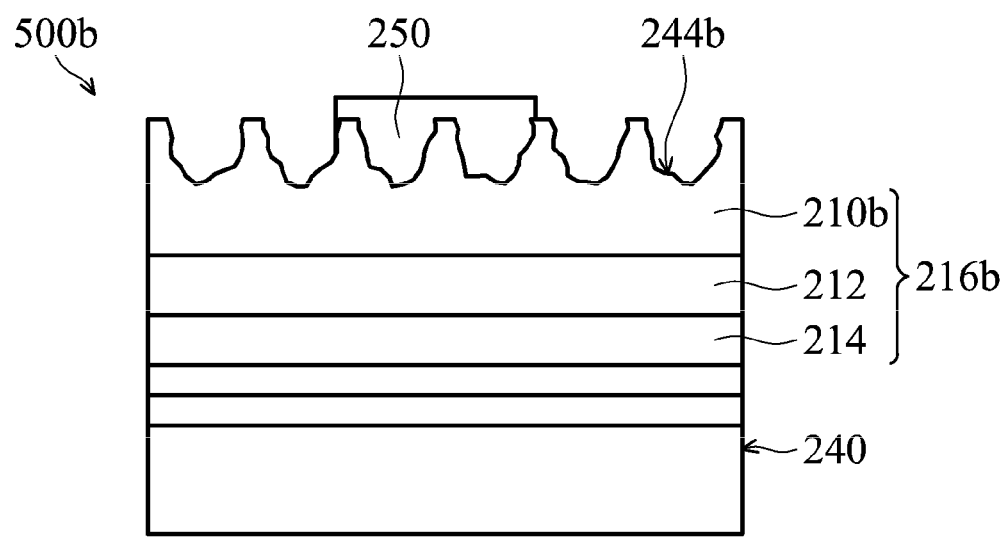

Next, a photolithography process is performed to form a photoresist layer covering the surfaces of the plurality of recess structures 244b of the first-type semiconductor layer 210b of the light-emitting lamination layer 216b as shown in FIG. 15. The photoresist layer has at least one opening (not shown) to expose the first-type semiconductor layer 210b. In one embodiment, formation positions of the at least one opening may correspond to a contact position defined on the first-type semiconductor layer 210b of the light-emitting lamination layer 216b. Next, a deposition process such as an electroplating method is performed to fill a conductive material (not shown) into the at least one opening of the photoresist layer. The conductive material is entirely filled the at least one opening. In one embodiment, the conductive material may be formed of copper (Cu), gold (Au), silver (Ag) or combinations thereof. Next, a planarization process, such as an etching back process, is performed to remove a portion of the conductive material over the photoresist layer, so that a top surface of the conductive material is substantially aligned to that of the photoresist layer. After performing the planarization process, a first-type electrode 250 is formed on the first-type semiconductor layer 210b having the plurality of recess structures 244b. After performing the aforementioned processes, one embodiment of the LED device 500b is formed completely.

Figure 17A:
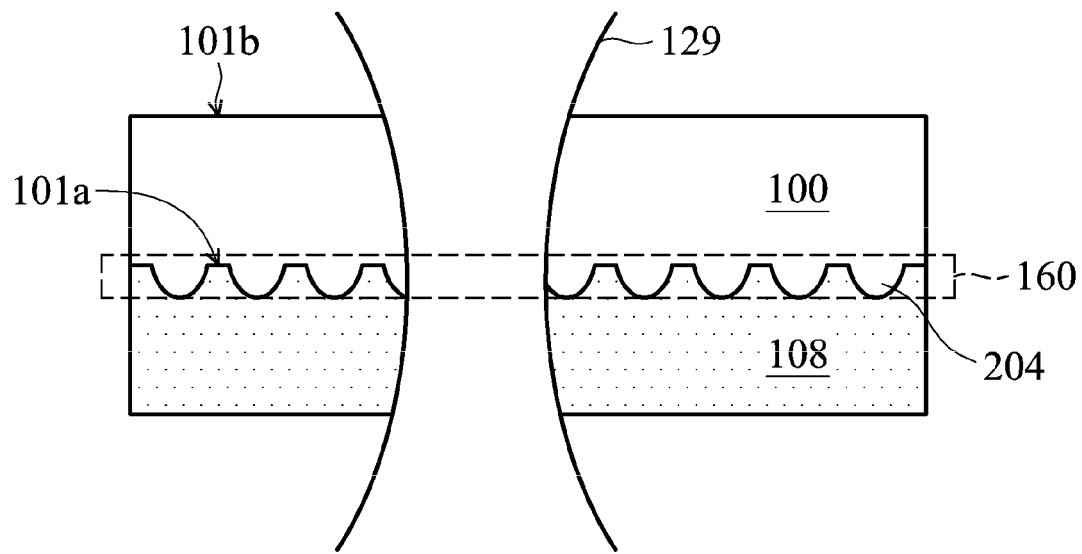
FIG. 17A is a schematic diagram of depth of focus (DOF) of the conventional laser lifting process.
Figure 17B:
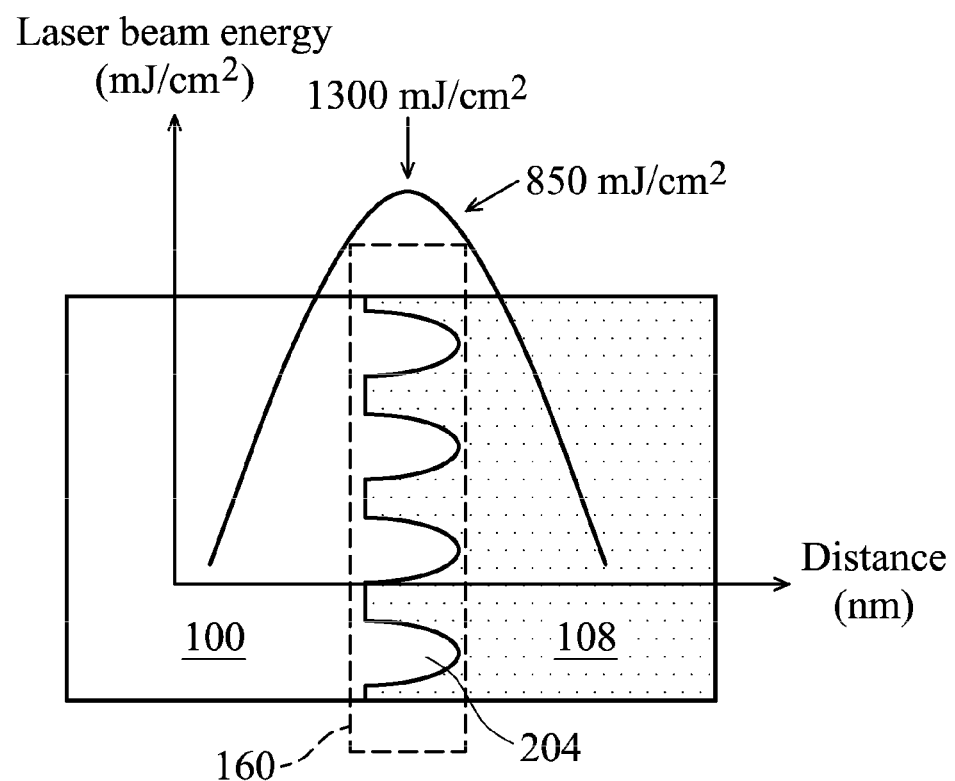
FIG. 17B is a schematic diagram showing a relationship between depth of focus (DOF) and energy of the conventional laser lifting process.
Figure 17C:
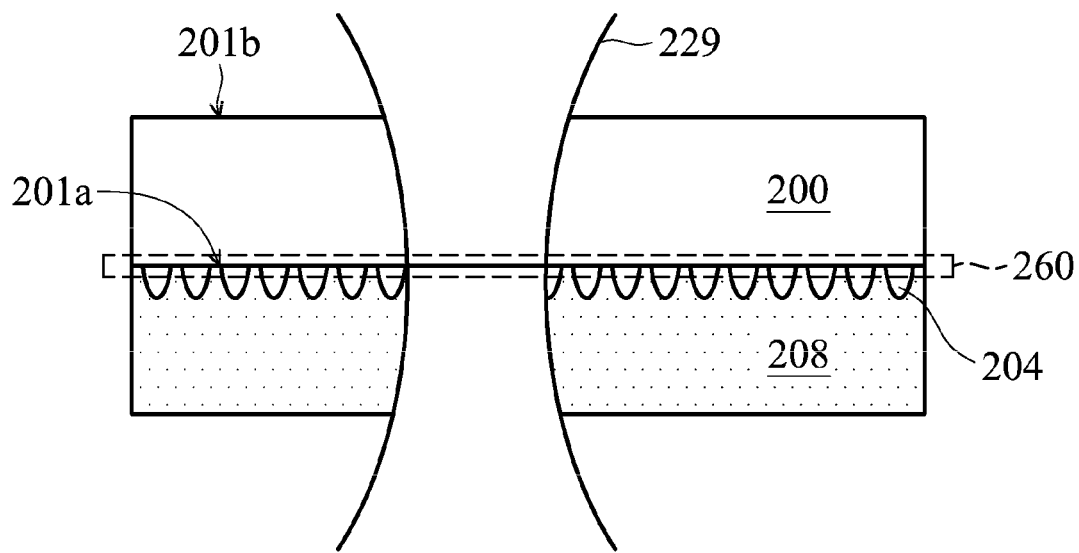
FIG. 17C is a schematic diagram of depth of focus (DOF) of one embodiment of a laser lifting process of the invention.
Figure 17D:
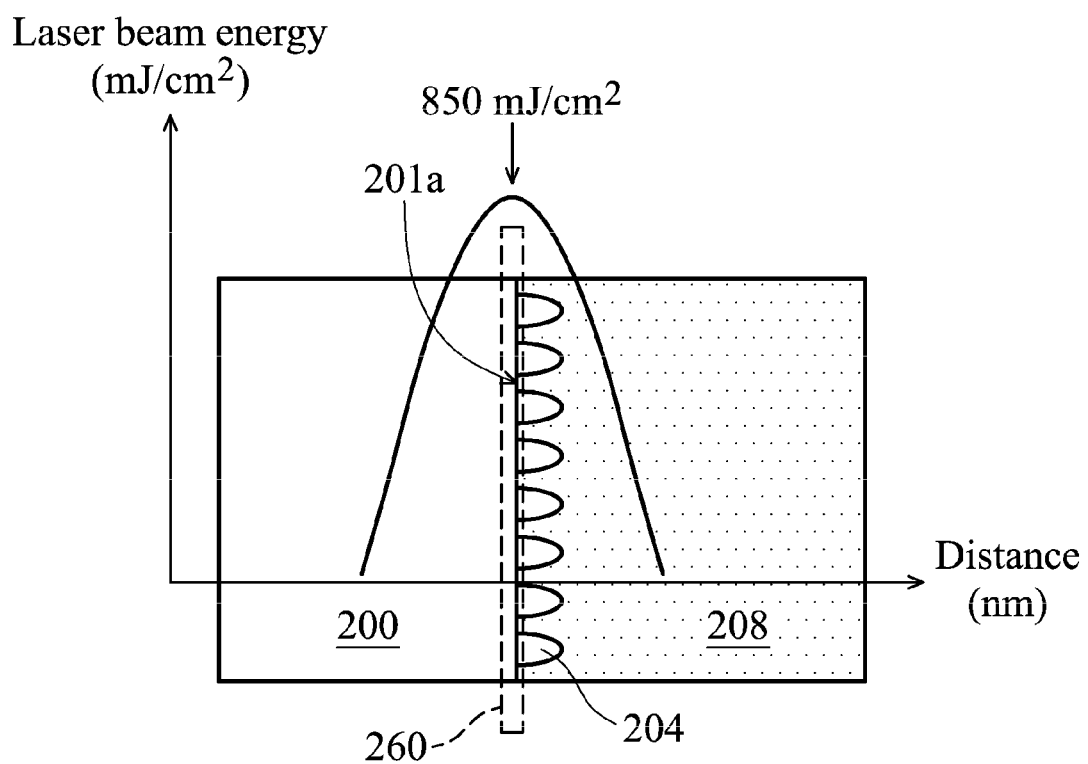
FIG. 17D is a schematic diagram showing a relationship between depth of focus (DOF) and energy of one embodiment of a laser lifting process of the invention.

FIG. 17A is a schematic diagram of depth of focus (DOF) of the conventional laser lifting process. FIG. 17B is a schematic diagram showing a relationship between depth of focus (DOF) and energy of the conventional laser lifting process. FIG. 17C is a schematic diagram of depth of focus (DOF) of one embodiment of a laser lifting process of the invention. FIG. 17D is a schematic diagram showing a relationship between depth of focus (DOF) and energy of one embodiment of a laser lifting process of the invention. Please refer to FIGS. 17A and 17B, during performing the conventional laser lifting process, a laser beam 129 is required to be focused a roughened surface 101a of the conventional patterned sapphire substrate (PSS) 100. Also, energy of the laser beam 129 positioned at any point of the roughened surface 101a is required to be larger than 850 mJ/cm² to ensure entirely lifting the conventional PSS 100 from a conventional buffer layer 108. The surface-roughness (Ra) of the roughened surface 101a of the conventional PSS 100 (i.e. an interface between the conventional PSS and the conventional buffer layer 108 of the conventional light-emitting lamination layer) is about 1000 nm. Therefore, the DOF of the laser beam 129 of the conventional laser lifting process (e.g. a depth of an area 160) is required to be enlarged to about 1000 nm. Additionally, during performing the laser lifting process, the energy of the laser beam to lift the PSS is required to be larger than 850 mJ/cm². Therefore, the energy of the laser beam 129 of the conventional laser lifting process is required to be larger than about 1300 mJ/cm² as show in FIG. 17B. The laser beam having over-high energy density will damage the LED devices and results in a low yield. Please refer to FIGS. 17C and 17D. Conversely, the laser beam 229 of one embodiment of a laser lifting process is focused on a planar interface (i.e. the first surface 201a of the carrier 200 which is in contact with the buffer layer 208) between the carrier 200 and the plurality of insulating micro patterns 204. Therefore, the DOF of the laser beam 229 of one embodiment of a laser lifting process (e.g. a depth of the area 260) is much less than that of the laser beam 129 of the conventional laser lifting process (e.g. a depth of the area 260 as shown in FIGS. 17A and 17B). The DOF of the laser beam 229 of one embodiment of the laser lifting process is only 25 nm (corresponding to the surface-roughness of the interface). Therefore, the maximum energy density of the laser beam 229 of one embodiment of the laser lifting process is required only to be larger than 850 mJ/cm² to ensure lifting off the carrier 200 such as a sapphire substrate. The maximum energy density of the laser beam 229 of one embodiment of the laser lifting process is much lower than that of the laser beam 129 of the conventional laser lifting process (FIG. 17B). One embodiment of the laser lifting process can reduce the maximum energy density of the laser beam, so that the LED device can be prevented from damage. The process yield of the LED device can be improved.

Embodiments provide a method for fabricating a light-emitting diode device. Compared with the conventional LED device fabrication processes, one embodiment of the laser lifting process is performed by focusing on a planar interface between the sapphire carrier and the silicon oxide micro patterns. One embodiment of the laser lifting process can reduce the maximum energy density of the laser beam, so that the LED device can be prevented from damages. The process yield of the LED device can be improved. Additionally, after removing the μm-scaled silicon oxide micro patterns, the μm-scaled recess structures can be formed on the n-type semiconductor layer. Also, after performing the surface-roughing process to roughen the n-type semiconductor layer, the μm-scaled recess structures can be roughened to have nm-scaled roughened surfaces. The n-type semiconductor layer having the μm-scaled recess structures with the nm-scaled roughened surfaces can further increase the light-emitting efficiency of the LED device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a light-emitting diode device, comprising:
   providing a carrier having a first surface and a second surface on opposite sides of the carrier, wherein the first surface has a plurality of insulating micro patterns, and wherein the carrier and the plurality of insulating micro patterns are formed by different materials;
   growing a buffer layer, a first-type semiconductor layer, a light-emitting layer and a second-type semiconductor layer on the first surface of the carrier in sequence to form a light-emitting lamination layer;
   providing a substrate for the second-type semiconductor layer of the light-emitting lamination layer to bond on;
   performing a laser lift-off process to lift off the carrier from the light-emitting lamination layer, and surfaces of the plurality of insulating micro patterns and a surface of the buffer layer between the plurality of insulating micro patterns are exposed;
   removing the plurality of insulating micro patterns and the buffer layer to form a plurality of recess structures on the first-type semiconductor layer; and
   performing a surface-roughing process on a plurality of surfaces of the plurality of recess structures.

2. The method for fabricating a light-emitting diode device as claimed in claim 1, further comprising:

performing an etching process on an area of the light-emitting lamination layer to partially remove the second-type semiconductor layer, the light-emitting layer and first-type semiconductor layer to expose a portion of the first-type semiconductor layer after forming the light-emitting lamination layer, thereby forming a light-emitting mesa structure; and respectively forming a first electrode and a second electrode on the first-type semiconductor layer and the second-type semiconductor layer of the light-emitting mesa structure, wherein the light-emitting mesa structure bonds on the substrate through the first electrode and the second electrode.

3. The method for fabricating a light-emitting diode device as claimed in claim 1, wherein the substrate is a semiconductor substrate comprising a pad layer and an ohmic contact layer, and the substrate bonds to the second-type semiconductor layer of the light-emitting lamination layer through the ohmic contact layer.

4. The method for fabricating a light-emitting diode device as claimed in claim 3, furthering comprising forming a first-type electrode on the plurality of surfaces of the plurality of recess structure of the first-type semiconductor layer.

5. The method for fabricating a light-emitting diode device as claimed in claim 1, wherein the plurality of insulating micro patterns is formed of silicon oxide materials.

6. The method for fabricating a light-emitting diode device as claimed in claim 5, wherein the plurality of insulating micro patterns are removed by a wet etching.

7. The method for fabricating a light-emitting diode device as claimed in claim 6, wherein the plurality of insulating micro patterns are removed by a buffer oxide etching (BOE).

8. The method for fabricating a light-emitting diode device as claimed in claim 7, wherein the surface-roughing process is performed by a dry etching or a wet etching.

9. The method for fabricating a light-emitting diode device as claimed in claim 1, wherein the size of the plurality of recess structure of the first-type semiconductor layer is in μm scale, and the size is in a range between about 1 μm and 5 μm.

10. The method for fabricating a light-emitting diode device as claimed in claim 1, wherein the size of the plurality of surfaces of the plurality of recess structures is in nm scale, and the size is in a range between about 10 nm and 1000 nm after performing the surface-roughing process.

* * * * *